United States Patent [19]

Buhlmann

[11] 4,125,895

[45] Nov. 14, 1978

[54] MAXIMUM-POWER MOTOR

[75] Inventor: Gerold P. Buhlmann, Stalden, Switzerland

[73] Assignee: Fritz Arn, Zürich, Switzerland

[21] Appl. No.: 827,807

[22] Filed: Aug. 25, 1977

[30] Foreign Application Priority Data

Aug. 26, 1976 [CH] Switzerland .................. 10825/76

[51] Int. Cl.² ........................................... H02J 3/00
[52] U.S. Cl. ................................. 364/483; 364/492;
235/92 EL; 307/31
[58] Field of Search ............... 364/483, 492, 493, 484;
307/31; 328/70, 136; 324/85; 323/1, 3; 235/92 EL

[56] References Cited

U.S. PATENT DOCUMENTS

| | | | |
|---|---|---|---|
| 3,775,683 | 11/1973 | Barta et al. | 364/483 X |
| 3,789,201 | 1/1974 | Carpenter et al. | 364/492 |
| 3,872,286 | 3/1975 | Putmann | 364/493 X |
| 3,998,093 | 12/1976 | Bertolasi | 364/483 X |
| 4,034,233 | 7/1977 | Leyde | 364/492 X |

Primary Examiner—Edward J. Wise
Attorney, Agent, or Firm—Karl F. Ross

[57] ABSTRACT

A maximum-power monitoring device and method whereby a direct-current voltage is derived which is proportional to the instantaneous power and is converted into a train of pulses in a voltage-frequency converter proportional to the power and these pulses are summed during an interval between two successive cyclic pulses. When the total exceeds a threshold value, a flip-flop is triggered. The state of the flip-flop controls a shift register which is periodically stepped with each cyclic pulse and "read". The reading is used to control a logic circuit, when it exceeds a predetermined value, for cutting off in accordance with predetermined (programmed) priorities, the loads or load sections of the monitored system. As a result, the mean peak demand is held at a predetermined level.

10 Claims, 1 Drawing Figure

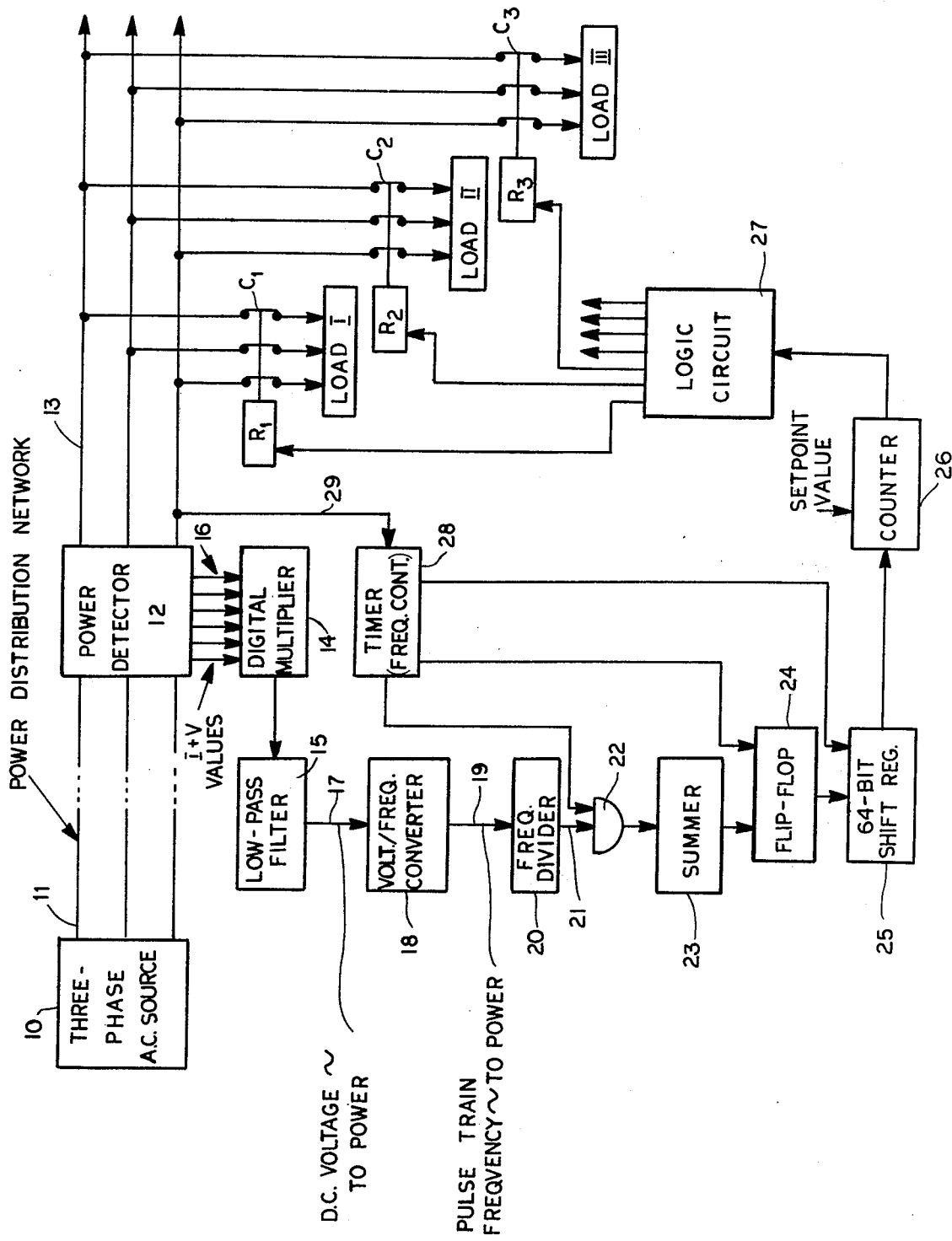

MAXIMUM-POWER MOTOR

FIELD OF THE INVENTION

The present invention relates to a maximum-power monitor and monitoring method and, more particularly, to a system for maintaining a predetermined mean electrical power demand over a predetermined period.

BACKGROUND OF THE INVENTION

The cost of supplying electrical energy includes fixed costs which depend upon the size of the installation and variable operating costs which are proportional to the output thereof. In order to distribute these costs most effectively to the consumers, electric power companies operate in accordance with a maximum tariff. Thus, apart from the actual consumption charge, there is applied a fee, generally known as the demand charge, which is determined by the highest power actually supplied over a predetermined period.

The measurement of electric power demand is carried on by a maximum or peak indicator or a demand meter.

For calculating the demand charge, it is desirable that brief or intermittent power peaks not be considered since they do not generally affect the fixed costs of generating electric power. As a result, it is desirable to use the value of the mean power over a relatively long period of 15 to 30 minutes for determining the power maximum. Conventional maximum indicators have a circular scale provided with a drag indicator. At the end of the desired reading time, the position of the drag indicator or pointer against the scale indicates the highest power maximum which has been detected.

Naturally, each consumer of power would like to hold its power maximum (demand) as low as possible. To this end, monitoring devices have been provided so that, when the maximum indicator reaches a predetermined power level, various loads or groups of loads are cut off from the supply network. Such automatic load-shedding reduces the drain and hence the power consumption of the monitored system and thereby prevents an increase in the demand charge.

The disadvantage of conventional monitoring devices is that they generally must be coupled with the maximum-power indicator and hence must be connected by control lines with the loads or groups of loads to be cut off. In a large system, e.g. a large industrial plant, farm or the like, these control lines may run distances of the order of kilometers. Another important disadvantage is to be found in the nature of the monitoring process. Conventional devices only become effective when a predetermined power level is attained to operate the load-shedding switches. This power level thus constitutes a switching threshold.

However, when the rate of increase of the power consumption is sharp, the actual triggering of the load-shedding devices may be too late to prevent an increase in the demand charge. On the other hand, the need to respond quickly once the threshold is reached may result in the cut off of a greater number of loads than is desirable so as to interrupt operation of the factory or otherwise interfere with the normal operating procedures of the system. Frequently, therefore, the use of the prior art system is a compromise between premature and undesirable cut off loads and delay in effecting the cut off of loads so that the demand charge will increase.

OBJECTS OF THE INVENTION

It is the principal object of the present invention to provide a device, unit or system, which obviates the disadvantages of earlier arrangements for the purposes described and which is not prone to excessive delay in responding to an excess power demand but also does not tend to cut off an excessive number of loads or load groups.

Still another object of the invention is to provide an improved method of maintaining a mean power demand over a predetermined period.

SUMMARY OF THE INVENTION

These objects and others which will become apparent hereinafter are attained, in accordance with the present invention, in an apparatus for monitoring the power drawn by a system having a plurality of loads and which comprises a device for generating a direct current voltage which is proportional to the power.

According to the invention, a voltage-frequency converter is connected to the power detector which has the aforementioned DC voltage output to convert this signal into a train of pulses of a frequency which is proportional to the detected power. The pulses of this signal are summed during the intervals between two cyclic pulses and, when the sum reaches a level above a threshold, a flip-flop is switched. The state of the flip-flop is detected in the form of an input to a shift register whose contents are evaluated at every cyclic pulse, the evaluated value, e.g. a count, being used to operate a logic circuit when it exceeds a predetermined value.

The logic circuit carries out a load-shedding or cut off of individual loads or groups of loads in accordance with programmed priorities and, of course, reconnects the cut off of loads or groups of loads to the main when the measured power is reduced sufficiently.

More specifically, the mean maximum power demand of an electrical installation, e.g. a factory, locality or farm, is monitored so as to monitor the power demand for which charges are applied substantially constant. In this monitoring method and apparatus, the current can pass through a current transformer connected in series with the load and provided with an internal load resistance which develops a maximum voltage which is proportional to the current flow. The current range can be broken down into a plurality of partial ranges. The output of this current detector is applied to an amplifier stage of variable gain so that, at the output for a nominal current flow, the signal is a voltage of, for example, 1 $V_{eff}$.

The mains voltage is transformed with phase correction from, for example, 220 $V_{eff}$ to a suitable lower level.

The current voltage signals are applied to a low-drift digital multiplier with appropriate phase-angle correction to generate an output which is passed through a low pass filter to eliminate the $\sin^2$ factor and provide a direct current voltage which is proportional in power. An amplifier can be provided at the output of the low-pass filter.

When the multiplier input has a nominal value of 1 $V_{eff}$ for the current and 2 $V_{eff}$ for the voltage with a phase angle cos $\phi$ of which, the output is a direct voltage of 0.5 volt.

This direct-current voltage proportional to power is applied to a very stable linear voltage frequency converter at the output of which a pulse train is obtained with a frequency proportional to power.

This power-proportioned frequency is applied to a frequency divider which, for each 408 input pulses, reverses the state of an IK flip-flop. The state of the flip-flop is detected with cyclic pulses controlled by the mains frequency (50 or 60 Hz) at an interval of 14.0625 seconds and is simultaneously reset. The state of the flip-flop is read into a 64-bit shift register. The cyclic pulses read the 64-bit register, the contents thereof are evaluated, e.g. in a counter for use in a process controller so that the shift regulator acts in a ring-counting system through each 64 steps. Each such cycle of the shift register brings about an internal organization of the information which is identical to the organization of the information which is identical to the organization before rotation. The number of positive bits is counted and represents the mean value of the power in the previous 15 minutes although the information is obtained every 14.0625 seconds.

When the positive bit count exceeds a predetermined setpoint value, the counter provides an output signal which is applied to the priority logic. In response to the logic circuit, a relay is controlled to cut off the load with the lowest priority. If the mean power during the next cycle is still in excess of the setpoint value, a further relay is controlled to cut off another load or group of loads with the next higher priority.

When the mean power is smaller than the setpoint value during the next cycle, after four cycles the relay with the highest priority is again operated to connect its load group to the mains. Four cycles have been chosen as the delay so that small load variations do not create a hunting situation in the control system. After a further four cycles, depending upon the count and its relationship to the setpoint value, a further load group can be connected.

BRIEF DESCRIPTION OF THE DRAWING

The above and other objects, features and advantages of the present invention will become more readily apparent from the following description, reference being made to the accompanying drawing the sole FIGURE of which is the block diagram illustrating the principles of the present invention.

SPECIFIC DESCRIPTION

In the drawing, a three-phase alternating-current source, such as an electric power generating plant, is represented at 10 an is connected to a power-distribution network 11 which runs to a large number of electrical installations which can be defined as groups of loads serviced by a common meter. Only one such installation has been shown in the drawing and the meter has not been illustrated but can be of a conventional type as described, for example, in MARKS' MECHANICAL ENGINEERS' HANDBOOK, McGraw-Hill Book Co., New York, 1958, chapter 15, pages 34ff.

Within the installation, main lines 13 run to a multiplicity of loads or load groups represented at I, II, III, ... To facilitate the load shedding or cutting off of these loads in accordance with a desired priority, each of the loads I, II, III is connected in series with a set of contacts $C_1$, $C_2$, $C_3$, operated by respective relays $R_1$, $R_2$, and $R_3$.

According to the invention, a power detector 12 of the type described above provides low voltage signals representing current and voltage values as shown at 16, which values are corrected for phase angle, to a digital multiplier 14, the output of which is applied to a low-pass filter 15.

As previously described, therefore, the low-pass filter, e.g. via an amplifier (not shown), delivers at 17 a direct current voltage which is proportional to the instantaneously detected power.

This signal is applied to a voltage/frequency converter 18 which transforms the input voltage into a train of pulses of a frequency proportional to the detected power and applied at 19 to a frequency divider. The output of the frequency divider 20 is applied to a summer 23 preferably by serving as an input at 21 to an AND gate 22 which is triggered by a frequency controlled timer 28. The latter is, in turn, triggered by or synchronized with the mains frequency delivered at 29 thereto. The timer output to the gate 22 corresponds to the interval between two working cycles as described above.

The output of or summer of adder 23 is applied to a flip-flop 24 which is read each operating cycle pulse from the timer 28, the state of the flip-flop 25 upon reading being applied to the 64-bit shift register 25 which can be the ring-connected type. The contents of the shift register are shifted through one stage with each operating cycle by the operating cycle pulse delivered from the timer 28. At each such pulse, moreover, at an interval of 14.0625 seconds, the contents of the shift register 25 are evaluated by a threshold counter 26 which can have a setpoint value and, when the count exceeds the setpoint value, can operate the priority-selection logic circuit 27 to first cut off one load group I, II, or III then another etc. in accordance with preprogrammed priorities. To this end the logic circuit is connected to the relays $R_1$ through $R_3$ and can be connected to other relays for other load groups as required.

I claim:

1. A monitoring device for maintaining a mean maximum power of an electrical installation having a plurality of loads connected to a supply network, said device comprising:

power-detector means responsive to the power drawn by said loads and producing a direct-current voltage proportionally to the drawn power;

a voltage-frequency converter connected to said power-detector means for transforming said direct-current voltage proportional to power into a pulse train of a frequency proportional to the detected power;

summing means connected to said converter for summing pulses of said train between two cycle pulses having an interval defining the cycle time of the device;

a flip-flop connected to said summing means and changing state upon said summing means accumulating a value in excess of a predetermined threshold;

a shift register connected to said flip-flop and registering the switching state thereof;

means for evaluating the contents of said shift register for each operating cycle; and a logic circuit connected to said evaluating means for disconnecting said loads in a succession determined by preprogrammed priorities upon an evaluation of the contents of said shift register manifesting an excess power drain during the respective operating cycle.

2. The device defined in claim 1 wherein said evaluating means includes a counter for accumulating the contents of said shift register and operating said logic when the accumulated count exceeds a predetermined setpoint value.

3. The device defined in claim 2 wherein said power detector means includes means for obtaining voltage signals representing the current traversing said network and the potential of said network;
   low-drift digital multiplier means receiving said voltage signals; and
   a low-pass filter connected to said digital multiplier means.

4. The device defined in claim 1 wherein said sequence of cycle pulses is controlled by the frequency of said network.

5. The device defined in claim 4 wherein said interval is exactly equal to 14.0625 seconds.

6. The device defined in claim 4 wherein said shift register is a 64-bit shift register.

7. The device defined in claim 1 wherein said logic circuit is constructed and arranged to reconnect the load with the highest priority to said network after a predetermined number of operating cycles.

8. A method of maintaining a predetermined power demand for an electrical installation connected to a supply network and having a plurality of loads, said method comprising the steps of:

producing a direct-current voltage representing the instantaneous power drawn by said installation from said network;
converting said direct-current voltage into a pulse train having a frequency proportional to said instantaneous power;
summing pulses of said train over a predetermined interval corresponding to an operating cycle;
changing the state of the flip-flop in response to the level of summed pulses as read once during each operating cycle;
recording the states of said flip-flop in a 64-bit shift register and stepping said shift register by one stage during each operating cycle;
registering the contents of said shift register in a counter during each of said operating cycles and comparing the register count to a setpoint value; and
in a predetermined sequence disconnecting said loads in accordance with preprogrammed priorities upon the count register iin said counter exceeding said setpoint value and at each such operating cycle at which said register count exceeds said setpoint value.

9. The method defined in claim 8 wherein said interval has a duration of 14.0625 seconds.

10. The method defined in claim 9 wherein said interval is synchronized with the frequency of said network.

* * * * *